United States Patent
Yang et al.

(10) Patent No.: US 9,929,709 B1
(45) Date of Patent: Mar. 27, 2018

(54) ELECTRONIC DEVICE CAPABLE OF ADJUSTING OUTPUT SOUND AND METHOD OF ADJUSTING OUTPUT SOUND

(71) Applicant: Unlimiter MFA Co., Ltd., Eden Island (SC)

(72) Inventors: Kuo-Ping Yang, Taipei (TW); Neo Bob Chih-Yung Young, Taipei (TW); Kuan-Li Chao, Taipei (TW)

(73) Assignee: UNLIMITER MFA CO., LTD., Eden Island (SC)

( * ) Notice: Subject to any disclaimer, the term of this patent is extended or adjusted under 35 U.S.C. 154(b) by 0 days.

(21) Appl. No.: 15/665,465

(22) Filed: Aug. 1, 2017

(30) Foreign Application Priority Data

Jun. 2, 2017 (TW) .............................. 106118256 A

(51) Int. Cl.
*H04R 25/00* (2006.01)
*H03G 3/32* (2006.01)
*G10L 21/034* (2013.01)

(52) U.S. Cl.
CPC ............. *H03G 3/32* (2013.01); *G10L 21/034* (2013.01)

(58) Field of Classification Search
CPC ........ H03G 3/32; G10L 21/034; H04R 25/00; H04B 7/00
USPC ...... 381/57, 59–60, 314, 103, 320, 312, 351
See application file for complete search history.

(56) References Cited

U.S. PATENT DOCUMENTS 6,813,490 B1 * 11/2004 Lang ................... H04M 1/6016
204/221
2010/0119093 A1 * 5/2010 Uzuanis ................. H04R 25/70
381/312

* cited by examiner

*Primary Examiner* — Melur Ramakrishnaiah
(74) *Attorney, Agent, or Firm* — Bacon & Thomas, PLLC

(57) ABSTRACT

An electronic device capable of adjusting output sound is disclosed. The electronic device determines hearing state of a user by voiceprint recognition, and adjusts frequency of output sound, such that the output sound coincides with the hearing state of the user.

10 Claims, 3 Drawing Sheets

| Sound feature analysis result 51 | Gender information 52 | Age informati | Estimated hearing parameter 54 |
|---|---|---|---|
| 0001 | Male | 0~40 | 1010101010101010 |
| 0010 | Female | 0~40 | 1010101010101010 |
| 0011 | Male | 41~50 | 1010101020203030 |
| 0100 | Female | 41~50 | 1010101010102020 |
| 0101 | Male | 51~60 | 1010101020303040 |
| 0110 | Female | 51~60 | 1010101010102030 |
| 0111 | Male | 61~70 | 1010101020304040 |
| 1000 | Female | 61~70 | 1010101010202030 |
| 1001 | Male | 71~80 | 1010202040506060 |
| 1010 | Female | 71~80 | 1010101010203040 |
| 1011 | Male | 81~90 | 1010202040507070 |
| 1100 | Female | 81~90 | 1010101020303040 |
| 1101 | Male | 91~100 | 1010203050607070 |
| 1110 | Female | 91~100 | 1010102030304050 |

FIG. 2

| Built-in voiceprint data 55 | User's hearing parameter 56 |
|---|---|
| 0010 | 1010101010101010 |
| 0100 | 1010101010101010 |
| 0110 | 1010101010102020 |
| 0111 | 1010101020303040 |
| 1011 | 1010202040506060 |

FIG. 3

ELECTRONIC DEVICE CAPABLE OF ADJUSTING OUTPUT SOUND AND METHOD OF ADJUSTING OUTPUT SOUND

BACKGROUND OF THE INVENTION

1. Field of the Invention

The present invention relates to a method capable of adjusting output sound, particularly to a method capable of adjusting the frequency of the output sound according to the hearing state of a user.

2. Description of the Related Art

With the rapid development of the Internet of Things (IoT), there are more and more devices equipped with the smart voice service function, which not only provides the voice control function to the users, but also answers the user's questions. Siri of Apple Inc., which is voice assistant software, for example, can answer most users' questions in a phonetic way.

However, the sound frequency of the existing voice service functions are all preset, and once a user has a hearing obstacle, for example, the elderly who has difficulty in hearing the high-frequency sound, will not be able to hear the sound responded by the system, and causing inconvenience to use.

SUMMARY OF THE INVENTION

It is a major object of the present invention to provide an electronic device capable of adjusting output sound according to a user's hearing state, and a method of adjusting output sound.

To achieve the above object, the electronic device capable of adjusting output sound in the present invention includes a microphone, a processing unit, and a speaker. The microphone is used for receiving a voice message issued by a user. The processing unit is electrically connected to the microphone. The processing unit includes a response message acquiring module, a sound comparison module, a determining module, and a sound adjustment module. The response message acquiring module is used for acquiring an original response voice message correspondingly adopted to reply to the voice message. The sound comparison module is used for analyzing the voice message to acquire a voiceprint data, and comparing to determine whether the voiceprint data coincides with built-in voiceprint data. The determining module is used for determining the age of the user according to the voice message when the voiceprint data did not coincide with the built-in voiceprint data, and determining an estimated hearing parameter according to the determined age. The sound adjustment module is used for adjusting the sound frequency of the original response voice message according to the estimated hearing parameter, to generate a first response voice message. The speaker, which is electrically connected to the processing unit, outputs the first response voice message.

The present invention further provides a method of adjusting output sound applicable to an electronic device. The method of adjusting output sound according to the present invention includes the following steps: receiving a voice message issued by a user; acquiring an original response voice message correspondingly adopted to reply to the voice message; analyzing the voice message to acquire a voiceprint data, and comparing to determine whether the voiceprint data coincides with built-in voiceprint data; if no, determining the age of the user according to the voice message, and determining an estimated hearing parameter according to the determined age; adjusting a sound frequency of the original response voice message according to the estimated hearing parameter, to generate a first response voice message; and outputting the first response voice message.

BRIEF DESCRIPTION OF THE DRAWINGS

FIG. 2 is a table showing the relationship among sound feature analysis results, age information, gender information and estimated hearing parameters;

FIG. 3 is a table showing the relationship between built-in voiceprint data and user's hearing parameters.

DETAILED DESCRIPTION OF THE PREFERRED EMBODIMENT

Hereafter, the technical content of the present invention will be better understood with reference to preferred embodiments.

Figure 1:
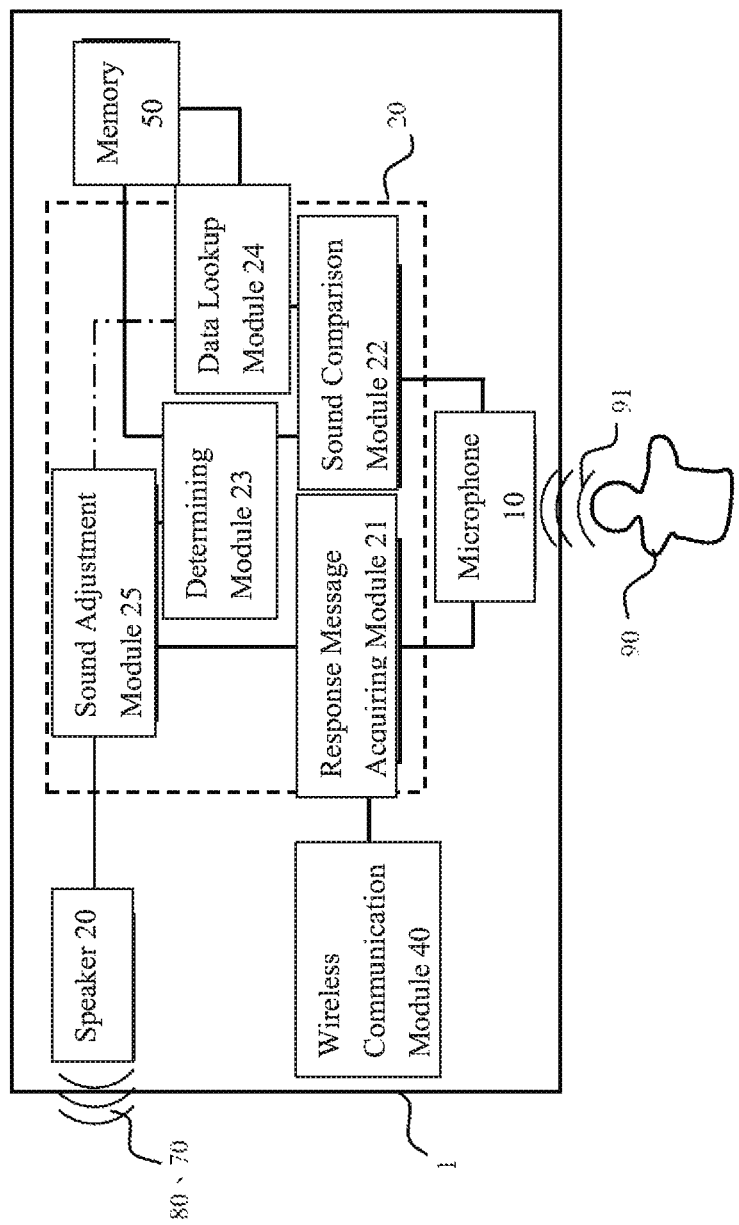
FIG. 1 is an architecture diagram of an electronic device capable of adjusting output sound in the present invention.

Hereafter, please first refer to FIGS. 1 to 3. Specifically, FIG. 1 is an architecture diagram of an electronic device capable of adjusting output sound in the present invention; FIG. 2 is a table showing the relationship among sound feature analysis results, age information, gender information and estimated hearing parameters; and FIG. 3 is a table showing the relationship between built-in voiceprint data and user's hearing parameters.

As shown in FIG. 1, in an embodiment of the present invention, an electronic device 1 capable of adjusting output sound in the present invention includes a microphone 10, a processing unit 20, a speaker 30, a wireless communication module 40, and a memory 50.

In an embodiment of the present invention, the microphone 10 is used for receiving a voice message 91 issued by a user 90. That is, the voice sound of the user 90 is received by the microphone 10.

In an embodiment of the present invention, the processing unit 20 is electrically connected to the microphone 10. The processing unit 20 includes a response message acquiring module 21, a sound comparison module 22, a determining module 23, a data lookup module 24, and a sound adjustment module 25. It should be noted that the above respective modules may not only be configured as hardware devices, software programs, firmware, or combinations thereof, but configured by circuit loop or other suitable types; also, each of the modules can be configured individually or in the form of combination. In a preferred embodiment, each of the modules is stored in the software program on the memory 50 and implemented by the processing unit 20 to achieve the functionality of the present invention. Additionally, the preferred embodiment of the present invention described here is only illustrative. To avoid redundancy, all the possible combinations of changes are not documented in detail. However, it shall be understood by those skilled in the art that each of the modules or elements described above may not be necessary. For the implementation of the present invention, the present invention may also contain other detailed, conventional modules or elements. Each module or component is likely to be omitted or modified depending on the needs. Other modules or elements may not necessarily exist between two of any modules.

In an embodiment of the present invention, the response message acquiring module 21 is used for acquiring an original response voice message correspondingly adopted to reply to the voice message 91. The relationship between the original response voice message and the voice message 80 has been preset. In the present embodiment, the response message acquiring module 21 analyzes the semantics of the voice message 91, and then acquires a corresponding original response voice message according to the analysis results. For example, assuming that the voice message 91 issued by the user 90 is "Will it rain today?", the content of the original response voice message can be set to "The rainfall probability of today is X %" (X depends on the actual weather forecasting). Thus, when analyzing and determining that the content of voice message 91 is "Will it rain today?" or similar semantics, the response message acquiring module 21 will also correspondingly acquire "The rainfall probability of today is X %" as the original response voice message.

It should be noted that the original response voice message can not only be acquired by the response message acquiring module 21 according to the semantic analysis results, but can be acquired from a server system (no shown) in other embodiments; in detail, in other embodiments, the electronic device 1 can be electrically connected to a server system having a smart voice service function. The response message acquiring module 21 can first send the voice message 91 to the server system for semantic analysis of the voice message 91, and then acquire an original response voice message correspondingly adopted to reply to the voice message 91 according to analysis results; after that, the response message acquiring module 21 acquires the original response voice message from the server system.

The aforementioned semantic analysis of human speech and responding to the appropriate response based on the analysis results is the existing technology (e.g. Siri of Apple Inc.; also referring to the relevant technical literature of text-to-speech (TTS)), which is well known to those having the ordinary knowledge in the field of sound processing technology, and will not be detailed hereafter.

In an embodiment of the present invention, the sound comparison module 22 is used for analyzing the voice message 91 to acquire a voiceprint data, and comparing to determine whether the voiceprint data coincides with built-in voiceprint data 55. Specifically, the built-in voiceprint data 55 has been stored in the memory 50 in advance and has a corresponding relationship with the user's hearing parameter 56 (as shown in FIG. 3). Also, the relationship between the built-in voiceprint data 55 and the user's hearing parameter can be entered by the potential user of the electronic device 1, where user's hearing parameter 56 is the minimum volume data that the user 90 can hear for different frequencies. However, the voiceprint recognition technology is the existing prior art, and its specific content and principles have been scattered in many patents or technical literature and well known to those having the ordinary knowledge in the field, and thus will not detailed hereafter.

In an embodiment of the present invention, the determining module 23 is used for determining the age and gender of the user 90 according to the voice message 91 when the voiceprint data does not coincide with the built-in voiceprint data 55, and determining an estimated hearing parameter 54 according to the determined age and gender. Determining the age and gender according to the voice of human speech is the existing technology, and its specific content and principles can be referred to in the relevant literature, which will not be detailed hereafter. After the determining module 23 determines the age and gender of the user 90, the estimated hearing parameter 54 can be acquired by looking up, for example, the table shown in FIG. 2. For example, assuming that the user 90 is 51 years old and the gender is male, with reference to FIG. 2, the determining module 23 will take the "1010101020303040" as the estimated hearing parameter 54.

In an embodiment of the present invention, the data lookup module 24 is used for acquiring the user's hearing parameter. 56 corresponding to built-in voiceprint data 55 when the voiceprint data coincides with the built-in voiceprint data 55. For example, assuming that the analyzed user's voiceprint data is "0110", which coincides with one of the built-in voiceprint data 55, at this time, the data lookup module 24 can acquire the content of the user's hearing parameter 56 as "1010101010102020" by looking up, for example, the table shown in FIG. 3.

In an embodiment of the present invention, the sound adjustment module 25 is used for adjusting the sound frequency of the original response voice message, according to an estimated hearing parameter 54 or a user's hearing parameter 56, to generate a first response voice message 80 or a second response voice message 70. Specifically, when the analyzed and acquired voiceprint data did not coincide with a built-in voiceprint data 55, the sound adjustment module 25 adjusts sound frequency of the original response voice message, according to the estimated hearing parameter 54 acquired by the determining module 23, to generate the first response voice message 80. Conversely, when the analyzed and acquired voiceprint data coincides with a built-in voiceprint data 55, the sound adjustment module 25 adjusts sound frequency of the original response voice message, according to the user's hearing parameter 56 acquired by the data lookup module 24, to generate the second response voice message 70.

Additionally, in other embodiments, when the user 90 inputs only the built-in voiceprint data 55 and does not enter the corresponding user's hearing parameter 56, in the case that the voiceprint data coincides with the built-in voiceprint data 55, the sound adjustment module 25 will adjust the sound frequency of the original response voice message according to the preset hearing parameter to generate the second response voice message.

In an embodiment of the present invention, the speaker 30 is electrically connected to the processing unit 20. The speaker 30 can be used for outputting the first response voice message 80 or the second response voice message 70.

In an embodiment of the present invention, the wireless communication module 40 is electrically connected to the processing unit 20. The wireless communication module 40 is used for connecting to the Internet to achieve wireless communication for the electronic device 1.

In an embodiment of the present invention, the memory 50 is electrically connected to the processing unit 20. The memory 50 is used for storing the relationship information between the original response voice message and the voice message 80, the relationship information among sound feature analysis results, age information, gender information, and estimated hearing parameter, and the relationship information between the built-in voiceprint data and user's hearing parameters.

Figure 4:
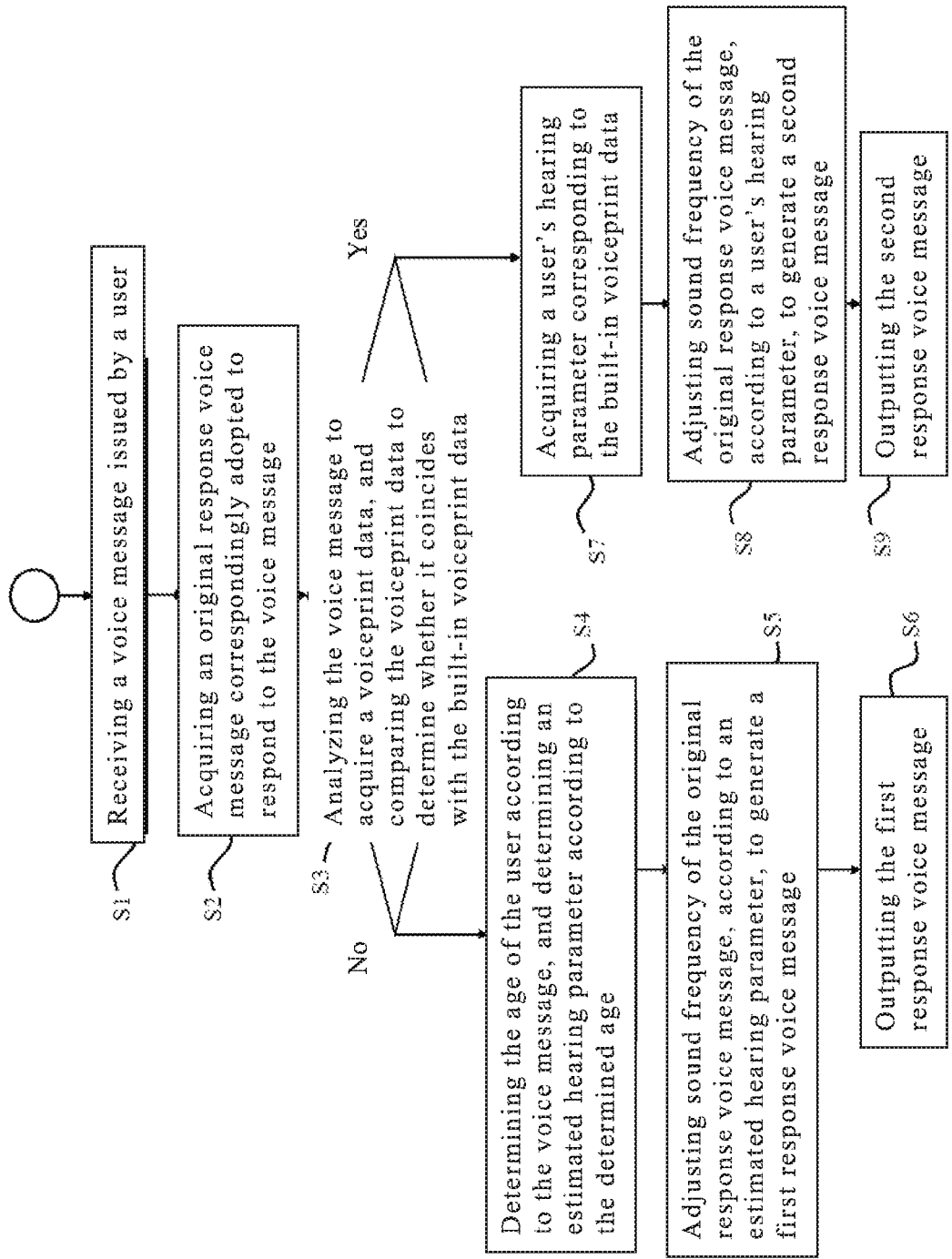
FIG. 4 is a flowchart showing steps in a method of adjusting output sound according to the present invention.

Then, please refer to FIGS. 1 to 4 together, wherein FIG. 4 is a flowchart showing steps in a method of adjusting output sound according to the present invention. Hereinafter, the steps shown in FIG. 4 will be described in turn with reference to FIGS. 1 to 3. However, it should be noted that, although the aforementioned electronic device capable of adjusting output sound 1 is used as an example hereinafter to describe the method of adjusting output sound in the present invention, the method disclosed in the present invention is not limited to the application of the electronic device 1.

Firstly, in Step S1: Receiving a voice message issued by a user.

When the smart voice service of the electronic device 1 is enabled, once the user 90 speaks to the electronic device 1 (i.e. a voice message is issued), the voice message 91 issued will be received by the microphone 10.

In Step S2: Acquiring an original response voice message correspondingly adopted to reply to the voice message.

After the voice message 91 is received, the response message acquiring module 21 of the processing unit 20 acquires an original response voice message correspondingly adopted to reply to the voice message 91. In an embodiment of the present invention, the response message acquiring module 21 of the processing unit 20 analyzes the semantics of the voice message 91, and acquires a corresponding original response voice message according to analysis results. Specifically, the original response voice message and the voice message 91 have the corresponding relationship which will be stored in advance.

It should be noted here that acquiring an original response voice message adopted to reply to the voice message is not limited to the manner described above. In other embodiments, the original response voice message can also be acquired by the response message acquiring module 21 from a server system (not shown); in detail, the electronic device 1 can be electrically connected to a server system having the smart voice service function. The response message acquiring module 21 can first send the voice message 91 to the server system for sematic analysis of the voice message 91, and then acquire an original response voice message correspondingly adopted to reply to the voice message 91 according to analysis results; after that, the response message acquiring module 21 acquires the original response voice message from the server system.

In Step S3: Analyzing the voice message to acquire a voiceprint data, and comparing the voiceprint data to determine whether it coincides with the built-in voiceprint data.

After the voice message 91 is received, in addition to acquiring an original response voice message adopted to reply to the voice message, the sound comparison module 22 of the processing unit 20 also analyzes the voice message 91 to acquire a voiceprint data. The sound comparison module 22 will compare to determine whether the voiceprint data coincides with the built-in voiceprint data 55. Specifically, the built-in voiceprint data 55 is stored in the memory 50 in advance and has corresponding relationship with the user's hearing parameter 56 (as shown in FIG. 3), both of which can be entered and set by one or more potential users through the electronic device 1 in advance.

In Step S4: Determining the age of the user according to the voice message, and determining an estimated hearing parameter according to the determined age and gender.

When comparing to determine that the voiceprint data does not coincide with any of the built-in voiceprint data 5, the determining module 23 of the processing unit 20 determines the age and gender of the user 90 according to the voice message 91, and according to the determined age and gender, acquires the estimated hearing parameter 54 using the chart shown in FIG. 2. For example, assuming that the user 90 is 51 years old and the gender is male, with reference to FIG. 2, the determining module 23 will take the "1010101020303040" as the estimated hearing parameter 54. Since determining the age and gender according to the voice of human speech is the existing technology, and its content and principles can be referred to in the relevant literature, it will not be detailed hereafter.

In Step S5: Adjusting sound frequency of the original response voice message, according to an estimated hearing parameter, to generate a first response voice message.

After Step S4 is completed, the sound adjustment module 25 of the processing unit 20 then adjusts sound frequency of the original response voice message according to the estimated hearing parameter 54, to generate the first response voice message 80.

In Step S6: Outputting the first response voice message 80.

After the first response voice message 80 is generated, the processing unit 20 then sends the first response voice message 80 to the speaker 30, such that the speaker 30 outputs the first response voice message 80 (i.e. playing the first response voice message 80).

In Step S7: Acquiring a user's hearing parameter corresponding to the built-in voiceprint data.

In an embodiment of the present invention, if it is determined in Step S3 that the voiceprint data coincides with one of the built-in voiceprint data 55, the data lookup module 24 of the processing unit 20 acquires the user's hearing parameter 56 corresponding to the built-in voiceprint data 55. In an example shown in FIG. 3, assuming that the analyzed user's voiceprint data is "0110", which coincides with the built-in voiceprint data 55, at this time, the data lookup module 24 can look up a table to obtain that the user's hearing parameter 56 is "1010101010102020".

In Step S8: Adjusting sound frequency of the original response voice message, according to a user's hearing parameter, to generate a second response voice message.

In an embodiment of the present invention, after Step S6 is completed, the sound adjustment module 25 then adjusts sound frequency of the original response voice message according to the acquired user's hearing parameter 56, to generate a second response voice message 70.

It should be noted here that, in other embodiments, when the user 90 only inputs the built-in voiceprint data 55 and does not enter any corresponding user's hearing parameter 56, in the case that the voiceprint data coincides with the built-in voiceprint data 55, the sound adjustment module 25 can adjust sound frequency of the original response voice message according to a preset hearing parameter, to generate the second response voice message 70.

In Step S9: Outputting the second response voice message.

After the second response voice message 70 is generated, the processing unit 20 sends the second response voice message 70 to the speaker 30 for outputting the second response voice message 70 (i.e. playing the second response voice message 70).

As disclosed above, the method of adjusting output sound in the present invention can acquire the hearing parameter of the user's hearing state, through the analysis of the voice message issued by the user, when the user of the electronic device 1 does not enter the hearing parameter data that matches the user's hearing state, such that the output voice frequency of the electronic device 1 can be more in line with the user's hearing state.

As described above, the objective, means, and efficiency of the present invention are all different from conventional characteristics in the prior art. It will be appreciated if the committee can review and grant a patent to benefit the society. However, it should be noted that the described embodiments are only for illustrative and exemplary, and that various changes and modifications may be made to the described embodiments without departing from the scope of the invention as disposed by the appended claims.

What is claimed is:

1. An electronic device capable of adjusting output sound, comprising:
   a microphone, used for receiving a voice message issued by a user;
   a processing unit, electrically connected to the microphone, wherein the processing unit comprising:
   a response message acquiring module, used for acquiring an original response voice message correspondingly adopted to reply to the voice message;
   a sound comparison module, used for analyzing the voice message to acquire a voiceprint data, and comparing to determine if the voiceprint data coincides with a built-in voiceprint data;
   a determining module, used for determining the age of the user according to the voice message when the voiceprint data does not coincide with the built-in voiceprint data, and determining an estimated hearing parameter according to the determined age; and
   a sound adjustment module, used for adjusting a sound frequency of the original response voice message according to the estimated hearing parameter, to generate a first response voice message; and
   a speaker, electrically connected to the processing unit, used for outputting the first response voice message.

2. The electronic device as claimed in claim 1, wherein the processing unit further comprises a data lookup module, which acquires a user's hearing parameter corresponding to the built-in voiceprint data when the voiceprint data coincides with the built-in voiceprint data; the sound adjustment module also adjusts the sound frequency of the original response voice message according to the user's hearing parameter, to generate a second response voice message; the speaker outputs the second response voice message.

3. The electronic device as claimed in claim 1, wherein the sound adjustment module further adjusts the sound frequency of the original response voice message according to a preset hearing parameter to generate a second response voice message when the voiceprint data coincides with the built-in voiceprint data; the speaker outputs the second response voice message.

4. The electronic device as claimed in claim 1, wherein the response message acquiring module analyzes the voice message, and acquires the original response voice message according to the analysis result.

5. The electronic device as claimed in claim 1, wherein the electronic device is electrically connected to a server system, and the response message acquiring module first sends the voice message to the server system, and then receives the original response voice message from the server system, and the original response voice message is acquired by the server system according to the result of analyzing the voice message.

6. A method of adjusting output sound, applicable to an electronic device, the method comprising the steps of:
   receiving a voice message issued by a user;
   acquiring an original response voice message correspondingly adopted to reply to the voice message;
   analyzing the voice message to acquire a voiceprint data, and comparing to determine if the voiceprint data coincides with a built-in voiceprint data;
   if no, determining the age of the user according to the voice message, and determining an estimated hearing parameter according to the determined age;
   adjusting a sound frequency of the original response voice message, according to the estimated hearing parameter, to generate a first response voice message; and
   outputting the first response voice message.

7. The method of adjusting output sound as claimed in claim 6, wherein if the voiceprint data coincides with the built-in voiceprint data, the method further comprising the steps of:
   acquiring a user's hearing parameter corresponding to the built-in voiceprint data; and
   adjusting the sound frequency of the original response voice message according to the user's hearing parameter to generate a second response voice message.

8. The method of adjusting output sound as claimed in claim 6, wherein if the voiceprint data coincides with the built-in voiceprint data, the method further comprising the steps of:
   adjusting the sound frequency of the original response voice message, according to a preset hearing parameter, to generate the second response voice message.

9. The method of adjusting output sound as claimed in claim 6, wherein the step of acquiring the original response voice message comprising:
   analyzing the voice message, and acquiring the original response voice message according to the analysis result.

10. The method of adjusting output sound as claimed in claim 6, wherein the electronic device is electrically connected to a server system, and the step of acquiring the original response voice message comprising:
    sending the voice message to the server system, such that the server system acquiring the original response voice message according to the result of analyzing the voice message; and
    receiving the original response voice message from the server system.

* * * * *